United States Patent
Moon (10) Patent No.: US 7,800,761 B2
(45) Date of Patent: *Sep. 21, 2010

(54) INFRARED INTERFEROMETRIC-SPATIAL-PHASE IMAGING USING BACKSIDE WAFER MARKS

(75) Inventor: Euclid E. Moon, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 199 days.

This patent is subject to a terminal disclaimer.

(21) Appl. No.: 11/734,402

(22) Filed: Apr. 12, 2007

(65) Prior Publication Data

US 2007/0242271 A1    Oct. 18, 2007

Related U.S. Application Data

(60) Provisional application No. 60/791,552, filed on Apr. 12, 2006.

(51) Int. Cl.
*G01B 11/02* (2006.01)
(52) U.S. Cl. .................................... 356/501
(58) Field of Classification Search ................. 356/499, 356/501, 505, 508
See application file for complete search history.

(56) References Cited

U.S. PATENT DOCUMENTS

| | | | |
|---|---|---|---|
| 3,614,235 A | 10/1971 | Munnerlyn | |
| 4,654,530 A | 3/1987 | Dybwad | |
| 4,999,010 A | 3/1991 | Mattson et al. | |
| 5,098,190 A | 3/1992 | Wijntjes et al. | |
| 5,426,302 A | 6/1995 | Marchman et al. | |
| 5,808,742 A * | 9/1998 | Everett et al. | 356/509 |
| 5,821,549 A * | 10/1998 | Talbot et al. | 250/307 |
| 6,075,908 A | 6/2000 | Paniccia et al. | |
| 6,222,198 B1 * | 4/2001 | Brown | 250/548 |
| 6,330,376 B1 | 12/2001 | Paniccia et al. | |
| 6,374,003 B1 | 4/2002 | Ding et al. | |
| 6,522,411 B1 * | 2/2003 | Moon et al. | 356/505 |
| 2005/0089762 A1 | 4/2005 | Consolini et al. | |
| 2005/0190374 A1 | 9/2005 | Chan et al. | |
| 2006/0292463 A1 | 12/2006 | Best et al. | |

FOREIGN PATENT DOCUMENTS

GB    2401934    11/2004

OTHER PUBLICATIONS

Moon et al., "Interferometric-spatial-phase imaging for six-axis mask control" American Vacuum Society, Nov./Dec. 2003, CP002453014, pp. 3112-3115.

(Continued)

*Primary Examiner*—Tarifur Chowdhury
*Assistant Examiner*—Jonathon D Cook
(74) *Attorney, Agent, or Firm*—Gauthier & Connors LLP (57) ABSTRACT

An interferometric-spatial-phase imaging (ISPI) system includes a substrate wafer. An alignment configuration is permanently embedded in the substrate wafer. The alignment configuration uses a global coordinate reference system by providing a plurality of global reference marks that encompass up to the entire substrate wafer. A plurality of alignment markings is provided on a surface in close proximity to the alignment configuration for obtaining continuous six-axis control of a scanning probe tip with respect to the global coordinate reference system.

30 Claims, 7 Drawing Sheets

OTHER PUBLICATIONS

Moon et al., "Dynamic alignment control for fluid-immersion lithographies using interferometric-spatial-phase imaging" 2005 American Vacuum Society, No/Dec. 2005, pp. 2607-2610.

Schattenburg et al., "Sub-100 nm metrology using interferometrically produced fiducials" 1999 American Vacuum Society, pp. 2692-2697.

Yang et al., "A Low Cost Infrared Alignment System for MEMS Research" MEMS 20002 Workshop Digest, pp. 219-222.

Mizra, "One Micron Precision, Wafer Level Aligned Bonding for Interconnect, MEMS and Packaging Applications" 2000 Electronic Components and Technology Conference, pp. 676-680.

* cited by examiner

FIG. 7A

INFRARED INTERFEROMETRIC-SPATIAL-PHASE IMAGING USING BACKSIDE WAFER MARKS

PRIORITY INFORMATION

This application claims priority from provisional application Ser. No. 60/791,552 filed Apr. 12, 2006, which is incorporated herein by reference in its entirety.

BACKGROUND OF THE INVENTION

The invention relates to the field of angstrom-level alignment and position, and in particular to angstrom-level alignment and position using an embedded coordinate system, without the use of alignment marks on the face of a wafer.

Previous forms of infrared alignment used conventional alignment marks, such as crosses and boxes, and were imaged with conventional optics. Resolution using conventional imaging techniques is limited to approximately $\lambda/2$. To view backside alignment marks, infrared illumination is required. At the longer, infrared wavelengths, resolution degrades, typically to 500 nm or more. In a special case, signal processing was applied to such low-resolution images to improve resolution in a 1000 nm-resolution infrared imaging system, signal processing techniques extended matching precision of a known pattern to infrared images within ~100 nm, which is still insufficient for many applications.

SUMMARY OF THE INVENTION

According to one aspect of the invention, there is provided an interferometric-spatial-phase imaging (ISPI) system. The ISPI system includes a substrate wafer. An alignment configuration is permanently embedded in the substrate wafer. The alignment configuration uses a global coordinate reference system by providing a plurality of global reference marks that encompass up to the entire substrate wafer. A plurality of alignment markings is provided on a surface in close proximity to the alignment configuration for obtaining continuous six-axis control of a scanning probe tip with respect to the global coordinate reference system.

According to another aspect of the invention, there is provided a substrate wafer used by an interferometric-spatial-phase imaging (ISPI) system. The substrate wafer includes an alignment configuration being permanently embedded in the substrate wafer. The alignment configuration uses a global coordinate reference system by providing a plurality of global reference marks that encompass up to the entire substrate wafer.

According to another aspect of the invention, there is provided a method of measuring alignment in an interferometric-spatial-phase imaging (ISPI) system. The method includes providing a substrate wafer. Also, the method includes permanently embedding an alignment configuration in the substrate wafer. The alignment configuration uses a global coordinate reference system by providing a plurality of global reference marks that encompass up to the entire substrate wafer. Furthermore, the method includes providing a plurality of alignment markings on a surface in close proximity to the alignment configuration for obtaining continuous six-axis control of a scanning probe tip with respect to the global coordinate reference system.

DETAILED DESCRIPTION OF THE INVENTION

The invention relates to a technique for alignment and position measurement using marks that are embedded in a wafer, such as on the wafer backside, and occupy zero area on the wafer frontside and device patterning areas.

Figure 1:
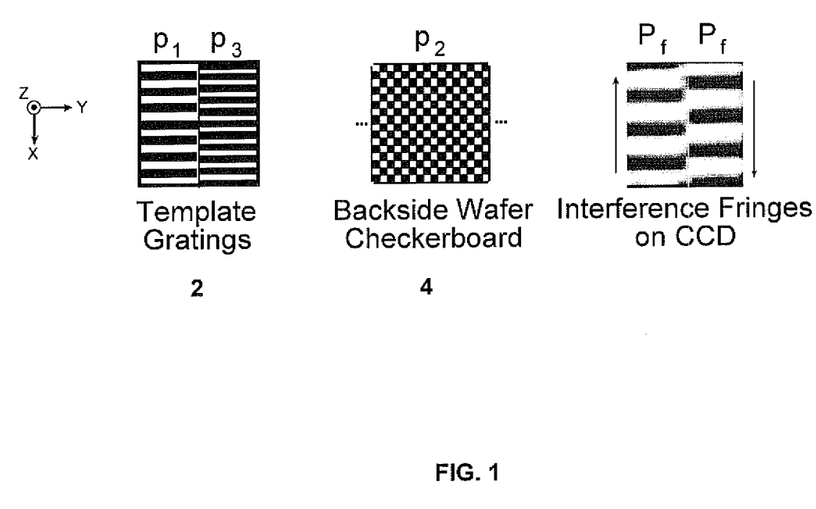
FIG. 1 is a schematic diagram illustrating designs of interferometric-spatial-phase imaging (ISPI) marks used with a template and the backside of a wafer.

The invention uses grating and checkerboard patterns on two surfaces, such as on a template and embedded in a wafer, as illustrated in FIG. 1. The design of interferometric-spatial-phase imaging (ISPI) marks consists of markings 2 with period p1 and p3 on a template in proximity to a wafer with markings 4 with period p2. The checkerboard marks 4 typically cover the entire wafer backside and have a period of p2 in two orthogonal directions. FIG. 1 shows template gratings for detecting displacement along the X direction. Y detection is done with marks identical to the shown template marks 2, but in the orthogonal direction. X and Y detection are performed using the same checkerboard marks 4. The CCD image of the interference fringes that result from superposition of template and wafer marks illustrates this point. In the preferred embodiment, $p_1=1.525$ μm, $p_2=1.500$ μm, and $p_3=1.475$ μm.

The marks are illuminated at an oblique angle with spatially-coherent infrared light and position information is encoded in the spatial phase relation between matched sets of interference fringes. In the preferred embodiment constant-period checkerboard marks 20 cover the backside of a wafer, or substrate, 18, as illustrated in FIGS. 2A-2B, combined with a plurality of constant-period gratings p1 and p3 on the frontside 17 of a second planar surface 12, such as an imprint template.

Figure 2A:
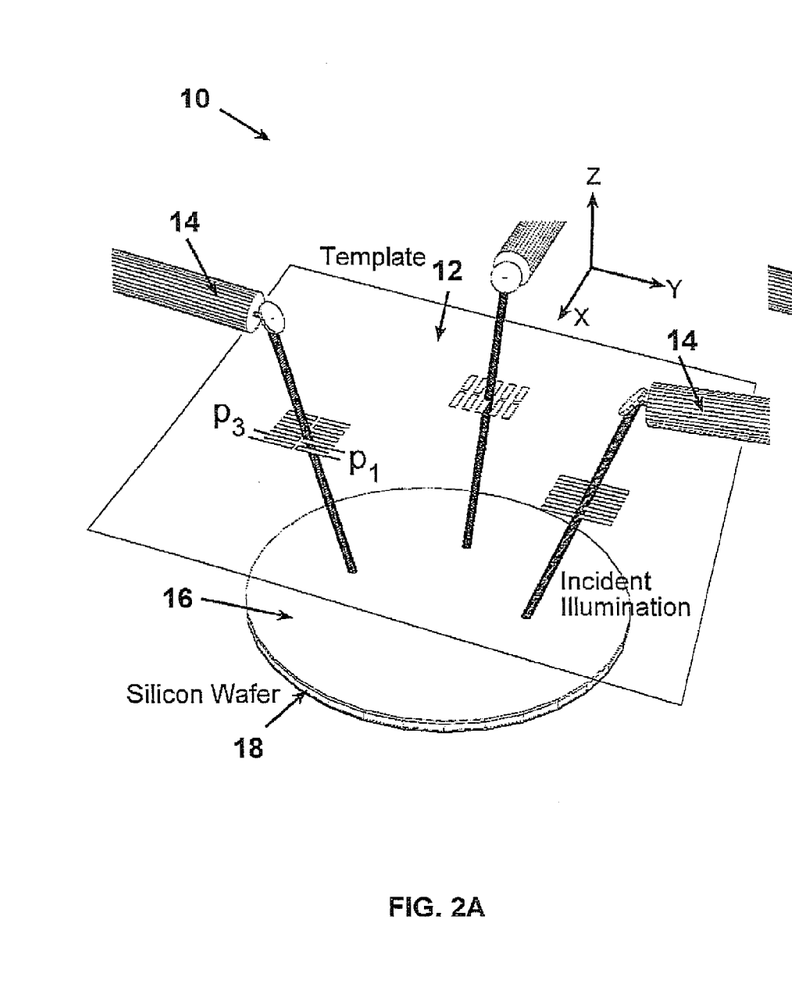
FIG. 2A is a schematic diagram illustrating the frontside view of ISPI marks and microscope arrangement.
Figure 2B:
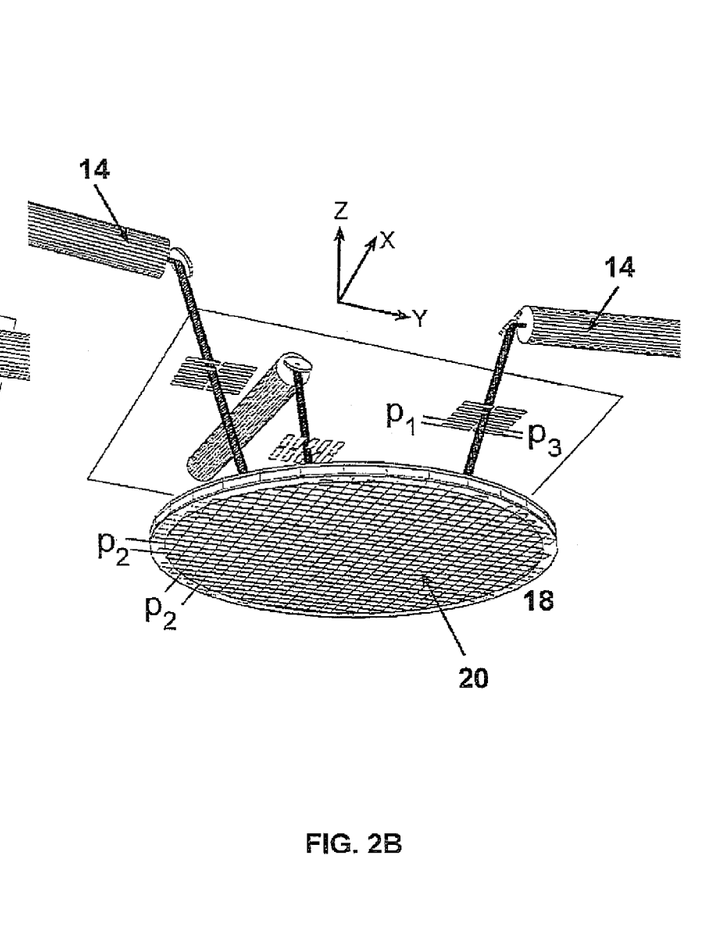
FIG. 2B is a schematic diagram illustrating the backside of ISPI marks and microscope arrangement.

In particular, FIG. 2A shows a frontside schematic view of an ISPI mark and microscope arrangement 10, observing template gratings p1 and p3 and backside checkerboard p2 marks 20 using spatially coherent infrared illumination. Note the complete absence of alignment marks on the device side 16 of the wafer 18. FIG. 2B shows a backside view of ISPI marks 20 and microscopes 14. The backside marks 20 are etched into the silicon wafer 18. Two microscopes 14 are shown for X detection and one for Y detection. Rotation is derived from the separate X readings. Note that the backside marks 20 are used for both X and Y position detection. Here the incident beam is illustrated, but for simplicity the multiply-diffracted return beams are omitted. A normal vacuum chuck can hold the wafer 18.

In an exemplary embodiment of the embedded ISPI marks 20, detection of X and Y position requires two orthogonal sets of {P1, P3} gratings on the template 12. The same period, P2, is used for X and Y directions in the checkerboard, allowing the same backside mark 20 to be used with either X- or Y-oriented template gratings p1 and p3. The periods are related by $p_1 > p_2 > p_3$, or $p_3 > p_2 > p_1$ to facilitate the formation of matched fringe pairs, which move in opposite directions in response to a displacement.

The gratings p1 and p3 and checkerboard markings 20 can be of either phase or amplitude type.

For a microscope oriented along the Y direction, the gratings are arranged with their k-vectors parallel to the X-axis. Similarly, for a microscope oriented along the X direction, the gratings p1 and p3 are arranged with their k-vectors parallel to the Y-axis.

The size and placement of the embedded mark 20 is constrained only by the size of the wafer 18 and the need to retain a narrow ring around the circumference of the wafer 18 for the purpose of maintaining vacuum, as for holding the wafer to a chuck.

**The mark design is distinct from the mark design established in U.S. Pat. Nos. 5,414,514 and 6,088,103, in which two periods $p_1$ and $p_2$ were used on both template and wafer, and the grating periods were reversed on the two surfaces, with $p_1$ superimposed over $p_2$, and $p_2$ over $p_1$. The reversal of periods is an equivalent way to achieve opposing fringe motion upon displacement.

In an alternative configuration of the invention, paired checkerboards of periods $\{p_2, p_1\}$ on the wafer 18 backside can be used with gratings of periods $\{p_1, p_2\}$ on the template 12 to produce interference fringes, akin to the previous ISPI configuration, albeit with the wafer marks moved to the backside. The backside wafer checkerboard markings 20 use $\{p_2, p_1\}$ in the transverse plane and $p_L$ for Littrow-angle backdiffraction in the incident plane.

An advantage of the monolithic embedded wafer mark design is that the relative position of the template 12 and wafer 18 can be detected over a wide range—by scanning the wafer 18 in X and Y, or by moving the ISPI microscopes 14 to multiple $\{p_1, p_3\}$ marks across the template 12. In general, measurement is possible at any point on the wafer 18, above which there is a $\{p_1, p_3\}$ grating pair on the template 12. The measurement range is limited only by the size of the wafer. In contrast, matched pairs of $\{p_1, p_2\}/\{p_2, p_1\}$ marks limit measurement range to a fraction of the size of each mark (typically ~100 μm).

The spatial phase relation of the embedded ISPI fringes is determined in the same way and by the same algorithm as the ISPI alignment fringes, i.e., by finding the phase value corresponding to the frequency fundamental in a cross-power spectrum algorithm, as evident to one versed in the art of signal processing. Unambiguous spatial phase measurement over the wafer area is described in a later section.

Figure 3:
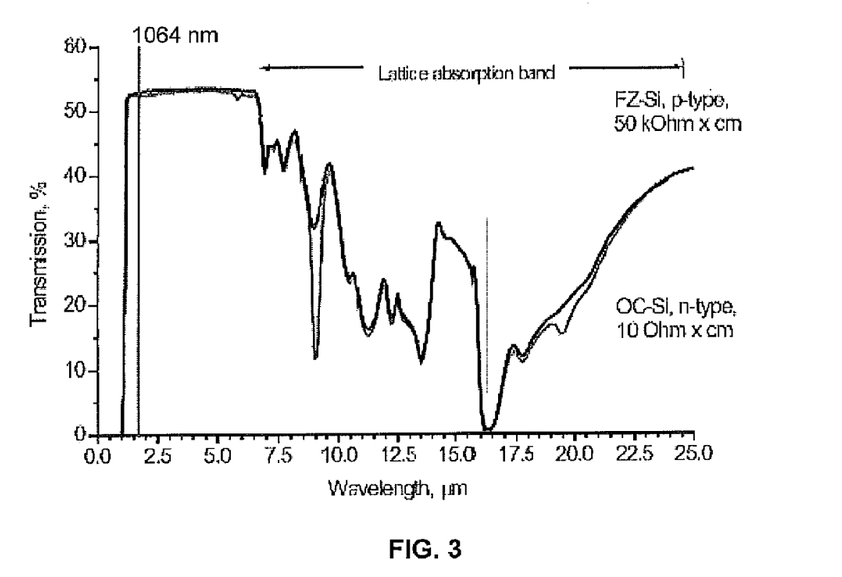
FIG. 3 is a graph illustrating transmission in silicon as a function of wavelength.

Silicon is transparent at wavelengths in a band between λ=1 μm and ~6 μm, as indicated in FIG. 3.

Available solid-state laser wavelengths in this range are 1064, 1120, 1300, and 1550 nm. Illumination at any of these wavelengths is also transmitted by the fused silica in the template (transmitting from λ=0.18 to 2.0 μm), and BK-7 glass used in the microscope optics (transmitting from λ=0.35 to 2.0 μm).

Monochrome camera response is at a maximum in the visible, with somewhat reduced response in the near-IR, enabling the same camera to be used for ISPI with both visible and infrared illumination, without using specialized indium gallium arsenide (InGaAs) camera sensors, which are typically designed to have large pixel dimensions and low spatial resolution. Use of a high-resolution camera sensor (many megapixels, and small pixel dimensions) is advantageous for ISPI fringe analysis.

The transmission of light through imprint fluid or water, which can fill the template-wafer gap, is also of significance in some applications. Water has low transmission in the red and near-IR part of the spectrum, with maximum absorption at 965 nm, beyond which there is a narrow transmission window centered at 1060 nm.

In an exemplary embodiment, a diode laser is used for illumination, with a wavelength of 1064 nm. The wavelength is chosen to be in the optimum transmission window common to silicon (wafer), fused silica (imprint template), BK-7 glass (microscope optics), and water, while remaining within the sensitivity range available to a monochrome, high-resolution camera sensor.

Consider diffraction in two orthogonal planes, called the incident plane and the transverse plane. The geometry of the planes and relation to the microscope and grating orientation is illustrated in FIG. 4.

Figure 4:
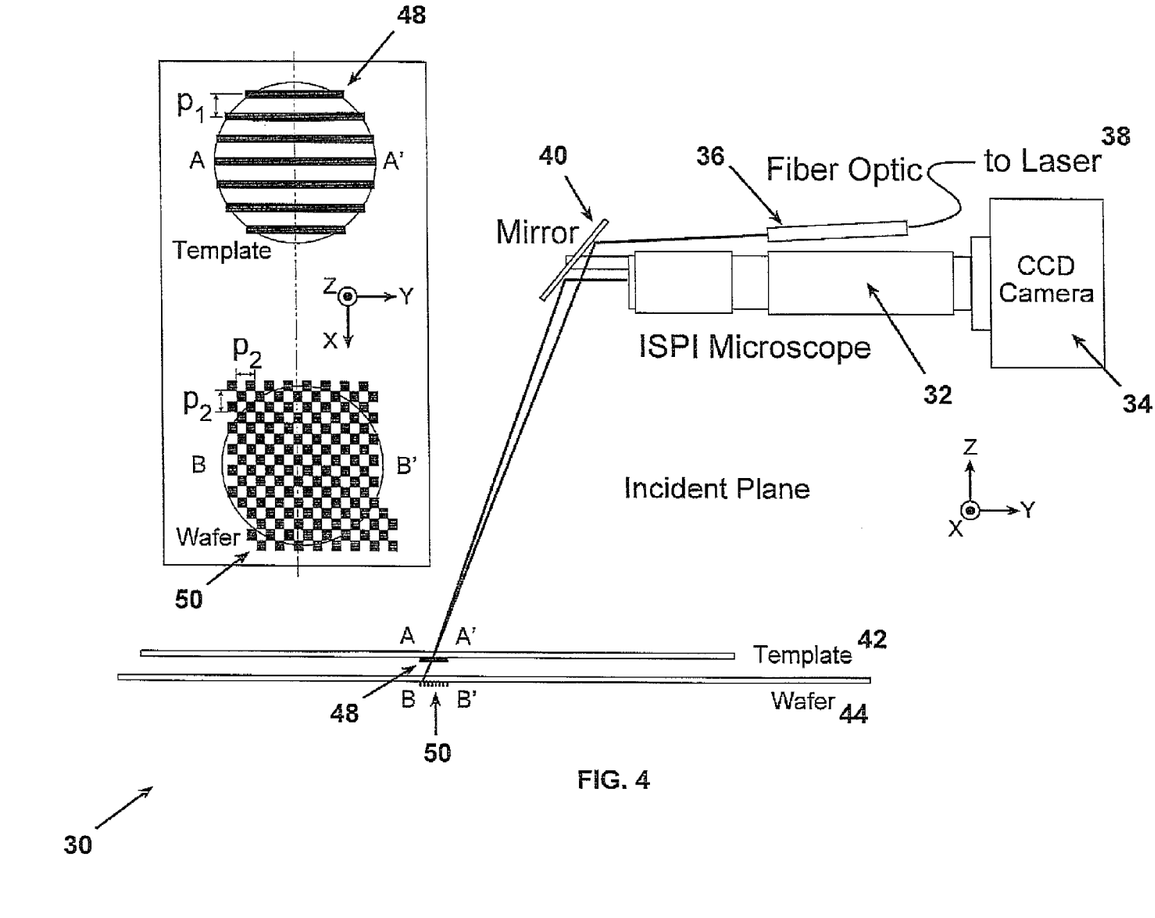
FIG. 4 is a schematic diagram illustrating an ISPI microscope having alignment marks.

FIG. 4 is a schematic of an ISPI microscope viewing alignment marks. The arrangement 30 includes an ISPI microscope 32 that is attached to a CCD camera 34 that receives reflected optical signals from a mirror 40. A laser 38 is connected to a fiber optic device 36 to form a single mode laser beam. The fiber optic device 36 sends incident light to the mirror 40 to be sent to a template 42 and a wafer 44. The template 42 includes ISPI markings 48 having a period p1 and a period p3 and the wafer 44 includes backside markings 50 having a period p2. Diffracted beams, which create the interference fringes, are symmetric on either side of an incident plane. The incident plane is the plane which contains the Z axis and the incident beam (in this case, the incident plane is the Y-Z plane). The transverse plane contains the backdiffracted, interfering beams that form the ISPI fringes and is perpendicular to the incident plane.

The period p2 of the checkerboard in the Y-direction, as shown in FIG. 4, is responsible for backdiffraction to the microscope. Considering a general case of diffraction, FIGS. 5A-5B illustrate forward- and back-diffracted beams in the incident plane for various illumination angles.

Figure 5A:
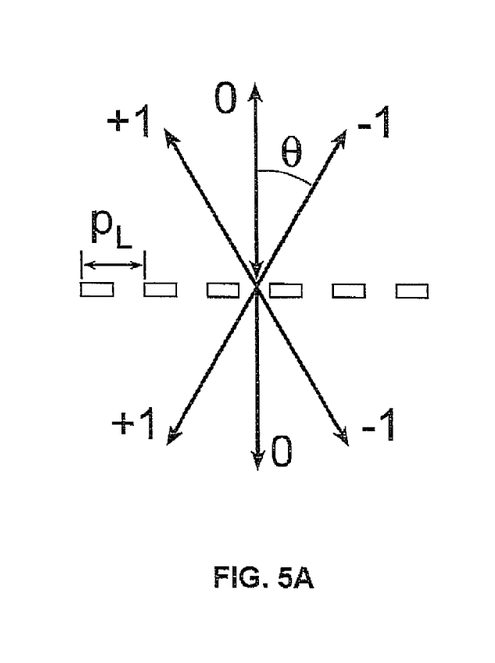
FIGS. 5A-5C are schematic diagrams illustrating forward and back-diffracted orders.
Figure 5B:
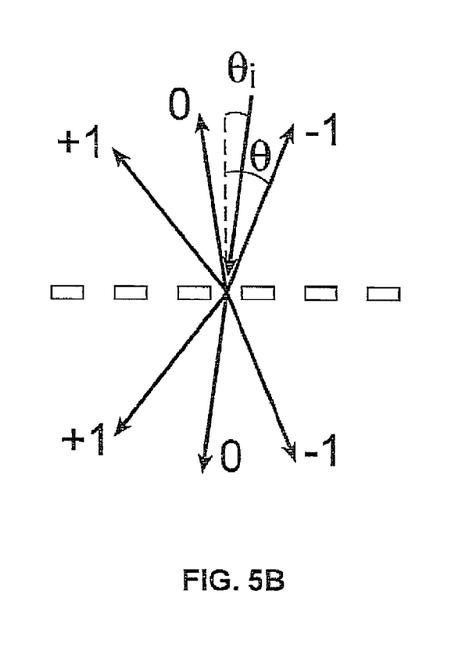
Figure 5C:
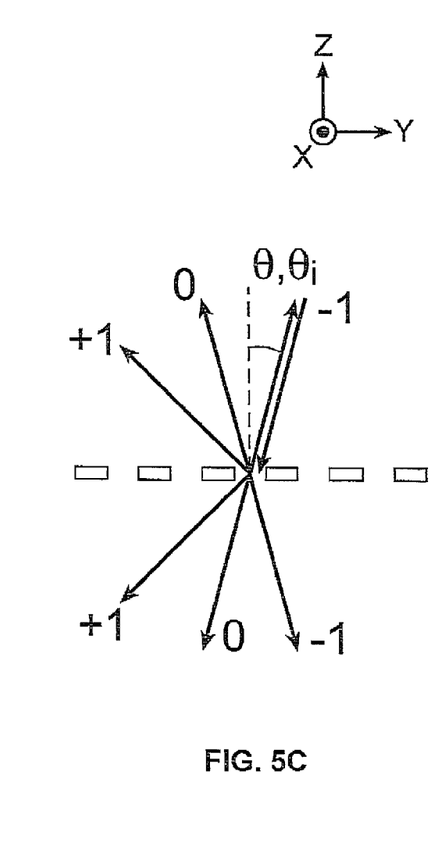

In FIG. 5A, the illumination angle is at normal incidence. FIGS. 5B and 5C show the illumination angle increasing, from the normal, to a finite angle, which results in backdiffracted orders moving in the opposite direction from the angle of the incident beam; hence, one encounters a particular oblique angle at which the incident and backdiffracted beams are collinear, referred to as the Littrow angle. The Littrow angle $\theta_L$ is given by $$\theta_{L(VISIBLE)} = \sin^{-1}\left(\frac{\lambda}{2p_L}\right) = \sin^{-1}\left(\frac{0.695}{2(1.000)}\right) = 20.33° \qquad \text{EQ. 1}$$

where λ is the wavelength and $p_L$ is the grating period used to obtain Littrow backdiffraction. In previous implementations of ISPI, typical values were λ=695 nm and $p_L$=1.000 μm, yielding a Littrow angle of 20.33°.

In ISPI, displacement detectivity scales linearly with the grating periods forming the interference fringes; therefore, to maximize alignment resolution it is desirable to minimize the grating period $p_2$. (In the present invention, the checkerboard periods in X and Y are identical, hence $p_L=p_2$.) Assuming a Littrow angle of ~20 degrees, one can decrease the period while using the shortest suitable infrared wavelength. Available solid-state laser wavelengths in the silicon transmission band are 1064 nm, 1120 nm, 1300 nm, and 1550 nm, as described in a previous section. Supposing a wavelength of 1064 nm, which yields $p_L=1.500$ μm, and a Littrow angle of 20.77 degrees:

$$\theta_{L(IR)} = \sin^{-1}\left(\frac{\lambda}{2p_L}\right) = \sin^{-1}\left(\frac{1.064}{2(1.500)}\right) = 20.77° \qquad \text{EQ. 2}$$

which is very nearly the same as the Littrow angle in EQ. 1 using visible illumination.

As is apparent from EQ. 1 and 2, different grating periods are required to achieve similar Littrow angles with visible and infrared illumination. The Littrow angle differences at the two wavelengths shown above are within the acceptance angle of the microscope optics.

Due to the similarity of Littrow angles, multiple wavelengths can illuminate backside ISPI alignment marks at the same time as the Transverse Chirp Gapping (TCG) or Long-Range Interferometric Gapping (LRIG) gapping marks. (Transverse Chirp Gapping (TCG) marks are described in U.S. Pat. No. 6,522,411, which is incorporated herein by reference.) In this way, both aligning and gapping marks can be viewed in the same field of view, and imaged onto the same CCD camera, but illuminated with different wavelengths, as accomplished with a beamsplitter in the illumination path. For alignment, infrared light passes through the wafer and diffracts from the backside ISPI marks, and in the case of gapping, visible light reflects off the silicon wafer, and diffracts from marks on the template, to form gap-dependent interference fringes.

In ISPI, position information is encoded in the spatial phase disparity between matched pairs of interference fringes. An interferometric fringe pattern is formed by interference of beams diffracted from periodic structures on a template and substrate. At a minimum, two coincident diffracted orders are required to form a fringe pattern.

Figure 6:
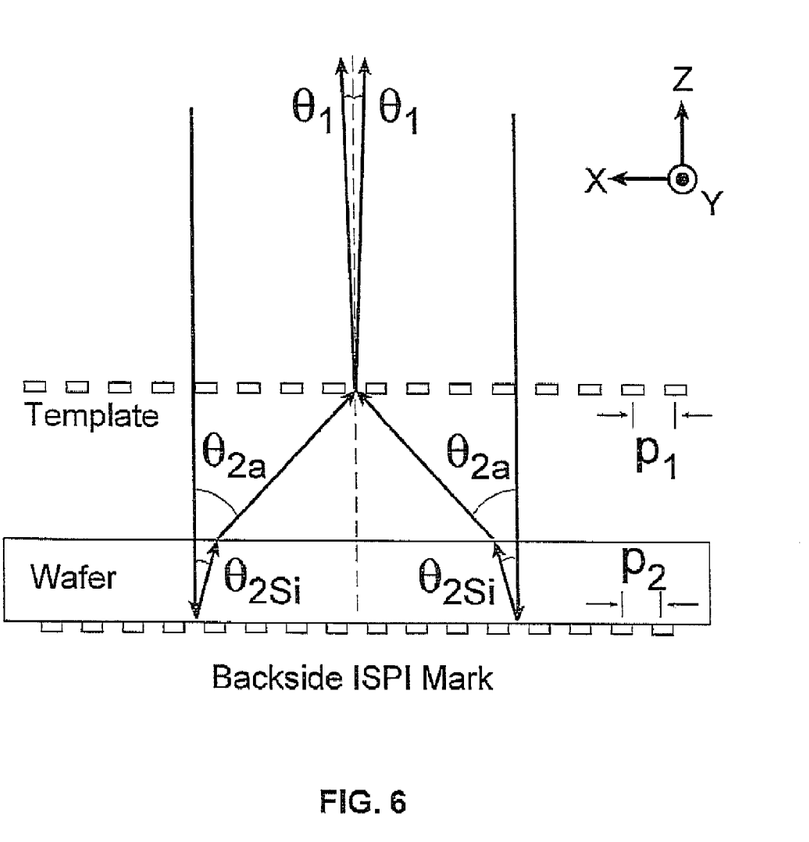
FIG. 6 is a schematic diagram illustrating diffracted beams inside a silicon wafer.

Consider a grating in the transverse plane with period $p_1$ on a template and a set of complementary marks on the backside of a silicon wafer with period $p_2$ in the transverse plane, as illustrated in FIG. 6.

The wavelength change within the silicon introduces a compensating factor, which allows cancellation of the index of refraction of silicon in the expression for the refraction angle. The angle of a first-order diffracted beam above the silicon is the same for frontside or backside marks. Although the optical path length changes during the passage through the silicon, the fringe frequency is unaffected by the silicon because fringe formation depends only on the angles between the diffracted beams. The fringe phase is unaffected as a result of equal and opposite phase changes in the two paths within the silicon.

Incident illumination of wavelength $\lambda_a$ is parallel to the incident plane, and diffracts from the backside mark. Inside the silicon the wavelength becomes $$\lambda_{Si} = \frac{n_a \lambda_a}{n_{Si}} \qquad \text{EQ. 3}$$

where $n_a$ and $n_{Si}$ are the refractive indices of air (1.000) and silicon (3.458 at 1064 nm), respectively. The angle of a first-order diffracting beam, $\theta_{2Si}$, inside the silicon is $$\theta_{2Si} = \sin^{-1}\left(\frac{\lambda_{Si}}{p_2}\right) = \sin^{-1}\left(\frac{n_a \lambda_a}{n_{Si} p_2}\right) \qquad \text{EQ. 4}$$

This diffracted beam refracts at the silicon-air boundary according to Snell's law $$n_a \sin\theta_{2a} = n_{Si} \sin\theta_{2Si} \qquad \text{EQ. 5}$$

and exits from the silicon frontside at an angle $\theta_{2a}$, given by $$\theta_{2a} = \sin^{-1}\left(\frac{n_{Si}}{n_a}\sin\theta_{2Si}\right) \qquad \text{EQ. 6}$$

Substituting for $\theta_{2Si}$, $$\theta_{2a} = \sin^{-1}\left(\frac{n_{Si}}{n_a}\left(\frac{n_a \lambda_a}{n_{Si} p_2}\right)\right) \qquad \text{EQ. 7}$$

leading to cancellation of the refractive indices, and $$\theta_{2a} = \sin^{-1}\left(\frac{\lambda_a}{p_2}\right) \qquad \text{EQ. 8}$$

which is equivalent to the diffraction angle of a mark with period $p_2$ on the wafer frontside. The angle of diffraction $\theta_1$ from the template grating $p_1$ is given by $$\theta_1 = \sin^{-1}\left(\frac{\lambda_a}{p_1} + \sin\theta_{2a}\right) \qquad \text{EQ. 9}$$

A second doubly-diffracted beam will emerge that is symmetric with the first, as a result of reversal of the sign of successive first orders. Interference between two symmetrically diffracted beams gives rise to interference with period $P_F$, given by $$P_F = \frac{\lambda_a}{2\sin\theta_1} \qquad \text{EQ. 10}$$

where the k-vector of the fringes lies in the transverse plane.

Expressing $\theta_1$ in terms of $p_1$ and $p_2$ $$\theta_1 = \sin^{-1}\left(\frac{\lambda_a}{p_1} + \sin\theta_{2a}\right) = \sin^{-1}\left(\frac{\lambda_a}{p_1} + \frac{-\lambda_a}{p_2}\right) \qquad \text{EQ. 11}$$

due to the sign reversal of the doubly diffracted beam, so $$\theta_1 = \sin^{-1}\left(\frac{\lambda_a}{p_1} - \frac{\lambda_a}{p_2}\right) \quad \text{EQ. 12}$$
$$= \sin^{-1}\lambda_a\left(\frac{1}{p_1} - \frac{1}{p_2}\right)$$
$$= \sin^{-1}\lambda_a\left(\frac{p_2 - p_1}{p_1 p_2}\right)$$

Substituting $\theta_1$ into EQ. 10 cancels out the dependence upon wavelength:

$$P_F = \frac{\lambda_a}{2\lambda_a\left(\frac{p_2-p_1}{p_1 p_2}\right)} = \frac{p_1 p_2}{2(p_2 - p_1)} \quad \text{EQ. 13}$$

For arbitrary values of $p_1$ and $p_2$ the interference fringe period is $$P_F = \frac{p_1 p_2}{2|p_1 - p_2|} \quad \text{EQ. 14}$$

The fringe period expression (EQ. 14) is identical to the expression for fringes from frontside marks, as can be seen by setting $n_3 = n_{Si}$. A similar expression is valid for $p_2$ and $p_3$.

The fringe period expression has no dependence upon the illumination wavelength, therefore the wavelength can vary without affecting the fringe period, allowing the use of a wide spectral bandwidth of light. A range of illumination wavelengths produces an identical fringe period for each wavelength.

In sum, consequences of the achromatic design of ISPI marks include (a) feasibility of mark illumination with broadband light (or an approximation thereto, consisting of multiple laser wavelengths), (b) alignment measurement independence from laser wavelength instability, so frequency drift or mode hopping will not affect the measurement, and (c) amenability of ISPI to the use of infrared illumination, while maintaining high detectivity.

In the current invention, detectivity is the same as in previous inventions, as described in U.S. Pat. Nos. 5,414,514 and 6,088,103, which are incorporated herein by reference. A single set of interference fringes cycles through one period during a change in alignment equal to $p_{av}/4$, where $p_{av}$ is the average period of the gratings and checkerboard. In a particular embodiment, $p_{av}=1.5$ μm and a $2\pi$ phase change between the fringes corresponds to a 375 nm displacement. Fourier-domain analysis of the relative phase between the fringe sets yields detection to $<\frac{1}{4000}$ of a phase cycle, resulting in detectivity <0.1 nm. Detectivity using backside ISPI marks is the same as with frontside ISPI marks, which was demonstrated experimentally to be $\sigma=0.05$ nm. The same phase relationship between the fringe sets is repeated for every displacement corresponding to a phase change of $2\pi$. Unique indication of phase changes of more than $2\pi$ must employ other means.

Figure 7A:
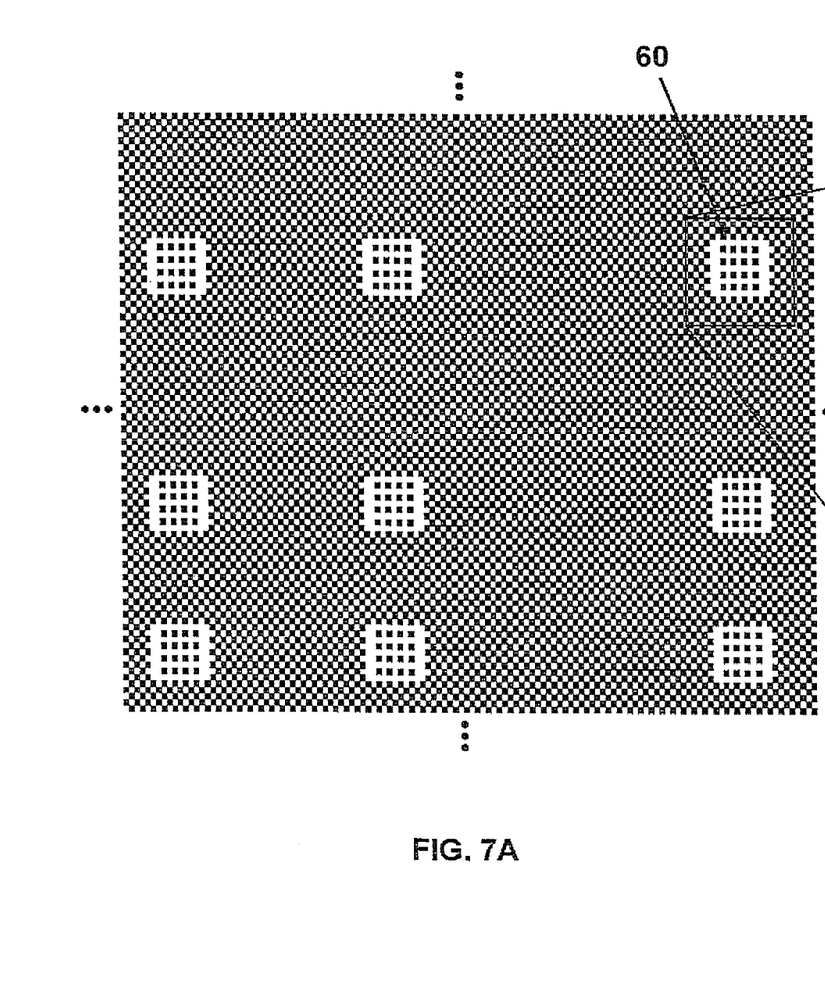
FIGS. 7A-7B are schematic diagrams illustrating a 2D chirped array of backdiffracting street-type marks in a backside-ISPI checkerboard mark.
Figure 7B:
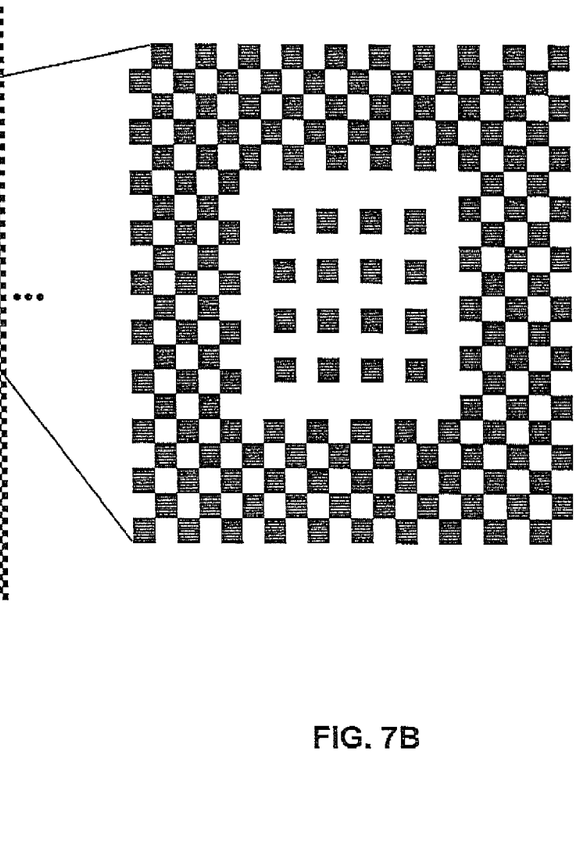

In an exemplary embodiment, phase ambiguity is eliminated with a chirped two-dimensional array of isolated street-type marks 60 dispersed throughout a checkerboard, as illustrated in FIG. 7A. Each street-type mark 60 consists of a two-dimensional grid, as shown in FIG. 7B. The period within each street-type mark 60 is a constant in both X and Y directions, and is the same as the period $p_2$ used in the checkerboard.

The checkerboards suppress zero-order backdiffraction, whereas the street-type marks permit direct backdiffraction to the ISPI microscopes. The chirped array is visible to ISPI microscopes regardless of marks on the template. Interference fringes are visible only when $\{p_1, p_3\}$ gratings are superimposed over the checkerboard. Absolute position at any point over the backside ISPI mark is encoded in the local spatial frequency of the chirped array, compared with the spatial frequency of the interference fringe pattern. Fine alignment information is encoded in the spatial phase relation of pairs of interference fringes.

Checkerboards and street-type marks are related in the sense that the checkerboard can be considered to be two interspersed street-type marks with a $\pi$-phase offset in X and Y. This viewpoint is evidenced by the diffracted orders observed from each type of mark: assuming normal-incidence illumination, the street-type mark emits diffracted orders within the cardinal (X-Z and Y-Z) planes, as well as in vertical planes along both diagonals. In contrast, a checkerboard suppresses diffraction along the X-Z and Y-Z planes due to the $\pi$-phase shift, and constrains all diffracted orders to lie within planes along the diagonals.

As a consequence of the diffraction geometries, when the incident illumination is at the Littrow angle, a single order backdiffracts from a street-type mark collinearly with the incident beam. No light returns from the checkerboard along the incident beampath. (Light is returned by the checkerboard pattern only when re-diffracted by the appropriate grating on the template. Light from the street-type pattern is visible in a microscope without any additional diffractions.)

A subset of the marks in FIGS. 7A-7B appears on a camera sensor as a 2D chirped array of bright spots in a black background. (The subset is determined by the ratio of the camera's field of view to the extent of the mark.) Interference fringes appear only where there are $\{p_1, p_3\}$ gratings above the checkerboard. The chirped array is visible to both X and Y microscopes.

Spatial phase ambiguity of the interference fringes is eliminated by comparison of the local spatial frequency of the 2D chirped array with the known spatial frequency of the interference fringes. Phase ambiguity is removed by a unique combination of spatial frequency and spatial phase for any point over the wafer.

Interference fringes and the 2D chirped array are observed by the same microscope, in the same field of view. The range of spatial frequencies in the 2D chirped array is distinct from the spatial frequency of the interference fringes, hence, the portion of the bright spots which overlap the interference fringes can be separated by spatial frequency filtering, as is apparent to one versed in signal processing.

In an alternative embodiment, a constant-period diffraction grating with periodic interruptions is on the template, which returns a set of beams that appear as bright spots on the camera sensor, arranged to be adjacent to the fringe pattern. The local spatial frequency of the 2D chirped array is compared to the spatial frequency of the constant-period diffracting array to overcome phase ambiguity of the interference fringes.

In other embodiments, unambiguous position measurement is attained with multiple pairs of gratings on the template, with each pair having a unique set of periods. In this case, the wafer backside mark consists of a pure checkerboard, with no street-type patterns. A phase relation is detected between the first and second fringe sets, and so on, with subsequent fringe sets. The range of unambiguous measurement is extended with each subsequent fringe set, and subsequent phase disparities. Since the phase relation between the two fringe sets of different periods will also be periodic, the range over which position is unambiguously detected in this manner depends upon use of multiple fringe sets from different grating periods.

It is apparent that a similar method of removing phase ambiguity of a first pair of interference fringes applies to additional fringe sets that are not paired, that is, the spatial phase ambiguity of a first pair of fringes using $\{p_1, p_3\}$ gratings is removed by phase and/or frequency comparison with one of the first pair of fringes and multiple, individual, and subsequent fringes produced by additional grating periods $p_4$, $p_5$, $p_6$, etc. superimposed over the embedded $p_2$ checkerboard.

The alternative techniques for removing phase ambiguity trade simplification of the embedded mark for increased complexity (and area) of the template marks.

In another embodiment, spatial phase ambiguity is overcome by means of a counter, which counts phase cycles while scanning the wafer from a location considered to be a coordinate origin. This embodiment requires only a $p_2$ checkerboard embedded within the wafer, but has the disadvantage of the inability to determine absolute position from a single image, and instead must rely upon scanning the wafer and remembering phase cycles.

In essence, the above embodiments provide a global fiducial reference and a means to detect position coordinates at any point over the wafer, with angstrom level precision, and no ambiguity. Each point on the surface of the wafer is provided with a unique coordinate. This global fiducial reference provides a constant and intrinsic coordinate system that is unaffected by wafer processing throughout the multilayer construction of devices and integrated circuits on the wafer frontside.

In an exemplary embodiment, the embedded mark is fabricated on a wafer from a master template using imprint lithography. The master template is made using various interferometric lithography techniques and spatial-phase-locked electron-beam lithography, endowing the mark on the master template with long-range spatial coherence. The mark is transferred from the master to the wafer backside using step-and-flash imprint lithography (S-FIL), and typically etched in relief into the wafer, or may be formed in a metal, using a liftoff process.

A monolithic embedded mark that has a consistent period from edge to edge is of particular value in providing a fixed and consistent coordinate reference. The interferometric lithography methods are ideally suited to fabrication of large-area, high-accuracy periodic structures. In distinction from previous ISPI mark designs, the design of an embedded ISPI mark is well matched to such fabrication methods, as certain embodiments contain only a single, fundamental period. In other embodiments, spatial-phase-locked e-beam lithography is preferred for writing a spatially-coherent master template containing an interspersed 2D chirped street-type array.

Other processes such as optical lithography or soft-contact lithography may be used to make the embedded mark, as apparent to one versed in semiconductor fabrication; however, the imprint process is especially suited to the task, based on its resolution, high transfer speed, large-area application, low pattern distortion, and consistency between wafers, as is valuable in wafer-to-wafer overlay, such as in micro-electrical-mechanical systems.

If desired, a backside chemical-mechanical polishing step may be used to remove the mark as a final step, after processing is completed, and before packaging.

In an exemplary embodiment of the invention, a large-area backside mark is imprinted onto a double-sided polished wafer from a master template. The imprint process, in particular step-and-flash imprint lithography, is well known for low pattern distortion during the transfer. However, certain circumstances, such as wafer-chuck-induced stress, may distort the backside mark. Therefore, it is beneficial to have a means of comparison for the backside mark, relative to the original master template, while the wafer is held in the lithography tool.

In a further embodiment of the invention, the master template has $\{p_1, p_3\}$ gratings on one face, and a large-area $p_2$ checkerboard on the opposite side. With the backside wafer held by a vacuum chuck, in the same way as it is held during lithography, the master template is inverted above the wafer, with the $\{p_1, p_3\}$ grating side towards the wafer. The $\{p_1, p_3\}$ gratings are illuminated with infrared light, using an ISPI microscope. As usual, light diffracts from the gratings towards the backside checkerboard, and returns, forming a set of interference fringes on the infrared-sensitive camera.

In addition, a symmetric set of beams are diffracted upwards from the $\{p_1, p_3\}$ gratings, to the master template checkerboard, which also returns a set of diffracted beams to the $\{p_1, p_3\}$ gratings, and which also forms a set of interference fringes, complementary to the set formed by diffraction from the wafer backside. The two sets of interference fringes overlap, resulting in constructive interference in the case of matching patterns in the master and backside wafer marks. Deviations of the backside wafer mark are immediately apparent as phase variations in the interference fringes. An X and a Y ISPI microscope observe their respective fringe sets from orthogonal $\{p_1, p_3\}$ marks. The wafer may be scanned in X and Y underneath the $\{p_1, p_3\}$ marks to evaluate the entire backside mark, or a portion thereof, as desired. In this way, distortions and in-plane stress in the wafer can be evaluated.

Note that different thicknesses of the wafer and the master template are permissible, due to the fact that the ISPI fringe formation is independent of gap.

Simultaneous illumination with visible light, and use of ISPI-type gapping marks, such as Transverse Chirp Gapping (TCG) or Long-Range Interferometric Gapping (LRIG) enables variations in wafer surface height to be evaluated during the wafer scan. The gapping marks are viewed in the same image as the alignment marks, and are used to provide complete evaluation of both in-plane and out-of-plane stress and distortion.

The three-dimensional stress and distortion map enables greater accuracy in alignment of multiple templates or wafers, or in parallel scanning probe lithography on the wafer surface.

Position detection using the invention requires incident and backdiffracted infrared beams to pass through device patterns, as they are fabricated on the frontside of a wafer. Absorption and diffraction of the illumination can occur, however, several factors mitigate potential degradation of the ISPI interference fringes by frontside patterns, such as ISPI microscopes have low numerical aperture (NA), and therefore act as a low-pass filter. Frontside patterns typically contain high spatial frequencies, which are outside the resolution limit of ISPI microscopes. The frontside features will typically be <50 nm, or about $\frac{1}{10}^{th}$ the resolution of the microscope at the infrared wavelength. ISPI fringe analysis filters out any spurious spatial frequencies that are not at the known fringe frequency. Frontside patterns are very thin, so absorption at the infrared wavelengths is very limited, even with layers of metals or insulators. Thin-film interference is minimal, considering the thinness of any frontside films, and the length of the infrared illumination.

The primary effect of the frontside patterns is to scatter a portion of the illumination. However, since the invention uses darkfield, oblique-incidence microscopes, the effect of scattering is minimal, due to the limited acceptance angle of the low-NA microscope, the fact that the signal is collected at the Littrow backdiffraction angle, while most of the scattering is in the forward diffracted and reflected directions, and the use of spatial phase and frequency encoding of position, resulting in insensitivity to variations in the signal amplitude.

In step-and-flash imprint lithography, alignment marks are typically designed to be in the narrow streets (<80 µm) between die areas, and outside the area covered by imprint fluid, which is constrained to a single die area. The template pattern for a single die is on an elevated mesa, and surface tension at the circumferential ridge constrains the imprint fluid. As a result, the alignment marks are not covered by imprint fluid, and therefore are unprotected. The bead of imprint fluid covering the mesa and pattern region is solidified by UV exposure at a small template-wafer gap, and the template is removed. Subsequent fields are aligned and exposed in the same way. When the entire wafer is patterned, it is removed from the imprint tool, and processed, such as with a reactive-ion etch, or metal deposition. The reactive-ion etch, or other process steps, will tend to erase, or bury, the unprotected alignment marks. New alignment marks need to be applied after each process step.

In an exemplary embodiment, a wafer has alignment marks etched into its backside, and the device patterns on the frontside.

A clear advantage of the invention over the prior art is that a single alignment mark can be utilized throughout the series of >20 process steps required to build up an integrated circuit. Cumulative errors are eliminated.

In the application of imprint lithography to photonic devices, it is highly desirable to have long-range spatial coherence. Typically, long-range consistency is limited by e-beam field stitching errors amounting to several 10 s of nanometers at each field boundary. In the invention, long-range accuracy on the 1-nanometer level is available to fabrication of any desired devices, including photonic devices.

In the most sophisticated commercial large-area scanning probe systems, stepper drives move the wafer between scan locations, allowing scans of 90×90 µm patches over a 200 mm-diameter wafer. Lateral positioning over the wafer has an accuracy of only 2 µm, based upon stepper drive resolution. Compounded with stepper drive inaccuracy, the accuracy within each piezo scan is 1% of its range, or 900 nm at the maximum scan size. In short, multiple scans are not related to each other in a meaningful way, and there are significant errors within each scan field.

At the other end of the spectrum, there are scanning probe microscopes designed to image small samples (<15 mm). Piezos with small scan ranges provide increased lateral resolution. A piezo with the smallest available scan range of 400×400 nm yields lateral position accuracy of 4-8 nm. Typically, these small-range piezo scanners operate in open loop. The highest lateral accuracy currently available on a commercial system is achieved with an internal closed-loop scanner, which claims 2 nm lateral position accuracy over a small scan range. However, all commercial closed-loop scanners use feedback control to stabilize the piezo within a coordinate system internal to the scanner, which permits discrepancies induced by thermal drift and vibration to occur between the tip and its intended position relative to the wafer.

Commercial scanning probe systems are therefore incapable of imaging or writing accurate nanometer-sized or molecular features over large areas. Such accuracy is necessary for fabrication of imprint templates with nanometer features, which must be capable of overlay between multiple device layers.

The invention inverts the current paradigm: instead of a coordinate system being imposed from the outside by a stage or closed-loop piezo, it embeds the coordinate system within the wafer itself. Position information is extracted from the wafer, not imposed externally by multiple systems.

The invention enables large-area, high-accuracy images to be collected by a scanning probe microscope, using feedback control of tip position relative to the wafer. In an exemplary embodiment, an array of individually actuated tips is attached to the template, or reference flat, as described in a previous disclosure by the author. Using this arrangement, multiple images are scanned simultaneously, each with a known spatial relation between them, as well as sub-nanometer positional accuracy within each image. The advantage of such large-area, high-accuracy scans becomes especially apparent in the application to semiconductor or template defect analysis.

In a similar way, the invention enables large-area, high-accuracy control of an array of tips for scanning probe lithography, as is desirable for fabrication of nanometer or molecular-sized features, such as on a wafer or an imprint template.

It is evident that large-area nanometer-accuracy tip control is benefited by embedded marks, which do not impede the lithographic process. Embedded marks, as described in the invention, are considered to be essential to a full and optimal implementation of tip control.

In wafer bonding, two wafers are brought into proximity, aligned, and bonded, as is common for fabrication of micro-electrical-mechanical systems. In the application of the invention to wafer bonding, one wafer contains a backside mark and the other wafer has $\{p_1, p_3\}$ marks. Alignment is observed using infrared illumination and ISPI microscopes, and the alignment signals are used to control the relative position of the wafers with angstrom-level accuracy, up to the point of bond formation.

Due to the use of infrared illumination, considerable latitude is available in the placement of the alignment marks, which can be both on the wafer backsides, or both on the frontsides, or one backside, and one frontside.

Wafer stress can be evaluated prior to bonding as described in a previous section. In addition, post-bonding wafer stress can be determined using the same method, or a variation that uses the $\{p_1, p_3\}$ marks on the bonded wafer to diffract symmetrically to the backside wafer mark and the face of the master template. (This variation involves moving the ISPI microscope synchronously with a scan of the bonded wafers, and is therefore less straightforward.)

The invention includes a method for measuring alignment using a global coordinate reference system, permanently embedded in a wafer. Global reference marks encompass up to the entire wafer backside, and are illuminated with infrared light in the silicon transparency band, slightly above $\lambda=1$ µm. Resolution limitations that commonly restrict infrared imaging to ~500 nm resolution are overcome with an interferometric imaging scheme in which resolution is independent of wavelength. Detectivity is on the angstrom level.

Further benefits of the invention are that the global reference mark is not subject to degradation during frontside processing, and provides a consistent coordinate reference throughout all process layers. The global reference system enables improved alignment as well as new capabilities, such as large-area molecular-level control using direct tip-to-wafer positioning in parallel scanning probe lithography, large-area high-accuracy scanning probe microscopy, and highly accurate imprint template fabrication and wafer bonding.

Although the present invention has been shown and described with respect to several preferred embodiments thereof, various changes, omissions and additions to the form and detail thereof, may be made therein, without departing from the spirit and scope of the invention.

What is claimed is:

1. An interferometric-spatial-phase imaging (ISPI) system comprising:
   a substrate wafer;
   an alignment configuration permanently embedded in the backside of said substrate wafer including a first marking element having at least one constant period in two orthogonal directions, said alignment configuration forms a global coordinate reference system by providing a plurality of global reference marks that encompass up to the entire substrate wafer; and
   a plurality of alignment markings on a separate surface positioned facing the frontside of the substrate wafer in close proximity but on the opposite side of said substrate wafer alignment configuration for obtaining continuous six-axis control of a scanning probe tip with respect to said global coordinate reference system, the alignment markings comprising at least two second marking elements on the separate surface including grating elements having different periods, wherein said first marking element and second marking elements are illuminated at an oblique angle with light having a wavelength to which the substrate wafer is transparent or illuminated with infrared light in the silicon transparency band.

2. The ISPI system of claim 1, wherein said alignment configuration provides zero area for global reference marks or alignment marks on the frontside of said substrate wafer.

3. The ISPI system of claim 1, wherein said global reference marks are not subject to degradation during frontside processing.

4. The ISPI system of claim 1 further comprising one or more checkerboard marks for providing a plurality of complementary alignment marks and a plurality of gap detection marks.

5. The ISPI system of claim 1, wherein said global reference marks comprise nanometer spatial accuracy over the entire wafer.

6. The ISPI system of claim 1, wherein said global reference marks, in combination with a plurality of periodic marks on a surface in close proximity, generate interferometric fringes by means of diffraction.

7. The ISPI system of claim 1, wherein said global reference marks comprise checkerboard marks.

8. The ISPI system of claim 6, wherein said interferometric fringes are formed using infrared illumination wavelengths and are observed using an infrared-sensitive camera.

9. The ISPI system of claim 6, wherein periodically-ambiguous position information from said interferometric fringes is resolved, using spatial frequency analysis of interference fringes referenced to a plurality of stationary and discrete backdiffracting elements, wherein each element comprises a two-dimensional subset grid of marks embedded within the substrate wafer to diffract a spot of illumination to a sensing camera, with the elements arranged in a variable-period, or chirped, array.

10. The ISPI system of claim 6, wherein unambiguous position information from said interferometric fringes is resolved using a plurality of periodic marks or one or more checkerboard marks.

11. A substrate wafer used by an interferometric-spatial-phase imaging (ISPI) system comprising:
    an alignment configuration permanently embedded in the backside of said substrate wafer including a first marking element having at least one constant period in two orthogonal directions, said alignment configuration forms a global coordinate reference system by providing a plurality of global reference marks that encompass up to the entire substrate wafer, wherein said global reference marks are illuminated at an oblique angle with light having a wavelength to which the substrate wafer is transparent or illuminated with infrared light in the silicon transparency band.

12. The substrate wafer of claim 11, wherein said alignment configuration provides zero global reference marks for alignment marks on the frontside of said substrate wafer.

13. The substrate wafer of claim 11, wherein said global reference marks are not subject to degradation during frontside processing.

14. The substrate wafer of claim 11 further comprising one or more checkerboard marks for providing a plurality of complementary alignment marks and a plurality of gap detection marks.

15. The substrate wafer of claim 11, wherein said global reference marks comprise nanometer spatial accuracy over the entire wafer.

16. The substrate wafer of claim 11, wherein said global reference marks, in combination with a plurality of periodic marks on a surface in close proximity, generate interferometric fringes by means of diffraction.

17. The substrate wafer of claim 11, wherein said global reference marks comprise checkerboard marks.

18. The substrate wafer of claim 16, wherein said interferometric fringes are formed using infrared illumination wavelengths and are observed using an infrared-sensitive camera.

19. The substrate wafer of claim 16, wherein periodically-ambiguous position information from said interferometric fringes is resolved, using spatial frequency analysis of interference fringes referenced to a plurality of stationary and discrete backdiffracting elements, wherein each element comprises a two-dimensional subset grid of marks embedded within the substrate wafer to diffract a spot of illumination to a sensing camera, with the elements arranged in a variable-period, or chirped, array.

20. The substrate wafer of claim 16, wherein unambiguous position information from said interferometric fringes is resolved using a plurality of periodic marks or one or more checkerboard marks.

21. A method of measuring alignment in an interferometric-spatial-phase imaging (ISPI) system comprising:
    providing a substrate wafer;
    permanently embedding an alignment configuration in the backside of the said substrate wafer including a first marking element having at least one constant period in two orthogonal directions, said alignment configuration forms a global coordinate reference system by providing a plurality of global reference marks that encompass up to the entire substrate wafer; and
    providing a plurality of alignment markings on a separate surface positioned facing the frontside of the substrate wafer in close proximity but on the opposite side of said substrate wafer alignment configuration for obtaining continuous six-axis control of a scanning probe tip with respect to said global coordinate reference system, the alignment markings comprising at least two distinct second marking elements on the separate surface including grating elements having different periods, wherein said first marking element and second marking elements are illuminated at an oblique angle with light having a wavelength to which the substrate wafer is transparent or illuminated with infrared light in the silicon transparency band.

22. The method of claim 21, wherein said alignment configuration provides zero area for global reference marks or alignment marks on the frontside of said substrate wafer.

23. The method of claim 21, wherein said global reference marks are not subject to degradation during frontside processing.

24. The method of claim 21, wherein said further comprising one or more checkerboard marks for providing a plurality of complementary alignment marks and a plurality of gap detection marks.

25. The method of claim 21, wherein said global reference marks comprise nanometer spatial accuracy over the entire wafer.

26. The method of claim 21, wherein said global reference marks, in combination with a plurality of periodic marks on a surface in close proximity, generate interferometric fringes by means of diffraction.

27. The method of claim 21, wherein said global reference marks comprise checkerboard marks.

28. The method of claim 26, wherein said interferometric fringes are formed using infrared illumination wavelengths and are observed using an infrared-sensitive camera.

29. The method of claim 26, wherein periodically-ambiguous position information from said interferometric fringes is resolved, using spatial frequency analysis of interference fringes referenced to a plurality of stationary and discrete backdiffracting elements, wherein each element comprises a two-dimensional subset grid of marks embedded within the substrate wafer to diffract a spot of illumination to a sensing camera, with the elements arranged in a variable-period, or chirped, array.

30. The method of claim 26, wherein unambiguous position information from said interferometric fringes is resolved using a plurality of periodic marks or one or more checkerboard marks.

* * * * *